(12) United States Patent
Corum et al.

(10) Patent No.: US 8,798,340 B2
(45) Date of Patent: Aug. 5, 2014

(54) DIPOLE MATCHED FILTER FOR MRI

(75) Inventors: Curtis A. Corum, Shoreview, MN (US); Michael G. Garwood, Medina, MN (US); Steen Moeller, Golden Valley, MN (US); Djaudat S. Idiyatullin, New Brighton, MN (US); Ryan Chamberlain, Maplewood, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 704 days.

(21) Appl. No.: 12/942,658

(22) Filed: Nov. 9, 2010

(65) Prior Publication Data

US 2011/0116696 A1   May 19, 2011

Related U.S. Application Data

(60) Provisional application No. 61/259,980, filed on Nov. 10, 2009.

(51) Int. Cl.
*G06K 9/00* (2006.01)
*A61B 5/05* (2006.01)

(52) U.S. Cl.
USPC .......................................... 382/128; 382/260

(58) Field of Classification Search
CPC ............ A61B 5/055; A61B 2019/5236; A61B 5/7207; G01R 33/5659; G01R 33/341; G01R 33/5601; G01R 33/56; G01R 33/56316; G01R 33/243; G01R 33/246; G01R 33/385; G01R 33/10; G01R 33/1276; G01R 33/543; G01N 24/08; G06T 5/00
See application file for complete search history.

(56) References Cited

U.S. PATENT DOCUMENTS

| | | | |
|---|---|---|---|
| 4,117,481 A | 9/1978 | Constant | |
| 4,678,996 A * | 7/1987 | Haacke et al. | 324/309 |
| 4,951,674 A * | 8/1990 | Zanakis et al. | 600/409 |
| 4,985,677 A * | 1/1991 | Pauly | 324/309 |
| 4,991,587 A * | 2/1991 | Blakeley et al. | 600/483 |
| 4,999,580 A * | 3/1991 | Meyer et al. | 324/309 |
| 5,025,216 A * | 6/1991 | Pauly et al. | 324/309 |
| 5,150,053 A * | 9/1992 | Pauly et al. | 324/309 |
| 5,233,992 A | 8/1993 | Holt et al. | |
| 5,239,474 A * | 8/1993 | Eaton et al. | 324/207.14 |
| 5,351,305 A * | 9/1994 | Wood et al. | 382/128 |
| 5,387,863 A * | 2/1995 | Lo et al. | 324/207.13 |
| 5,534,777 A * | 7/1996 | Fuderer et al. | 324/309 |
| 6,073,041 A * | 6/2000 | Hu et al. | 600/410 |
| 6,192,264 B1 * | 2/2001 | Foo et al. | 600/413 |
| 6,255,820 B1 * | 7/2001 | Steckner | 324/309 |
| 6,377,831 B1 * | 4/2002 | Seshan et al. | 600/407 |
| 6,528,997 B2 * | 3/2003 | Zhong et al. | 324/307 |
| 6,658,280 B1 * | 12/2003 | Haacke | 600/410 |
| 7,835,783 B1 * | 11/2010 | Aletras | 600/413 |

(Continued)

OTHER PUBLICATIONS

Corum, C., "Dipole Matched Filter K-space (amplitude)", CMRR Garwood Group, (May 8, 2009), 9 pgs.

(Continued)

*Primary Examiner* — Manav Seth
(74) *Attorney, Agent, or Firm* — Schwegman Lundberg & Woessner, P.A.

(57) ABSTRACT

A method includes receiving k-space data corresponding to magnetic resonance data for a subject and selecting a template for analysis. In addition, the method includes generating an image using the k-space data and using the template.

25 Claims, 1 Drawing Sheet

(56) References Cited

U.S. PATENT DOCUMENTS

| | | |
|---|---|---|
| 8,232,799 B2 * | 7/2012 | Hajian et al. .................. 324/309 |
| 2008/0169808 A1 * | 7/2008 | Taniguchi et al. ............ 324/307 |
| 2009/0136104 A1 * | 5/2009 | Hajian et al. .................. 382/128 |
| 2011/0044524 A1 * | 2/2011 | Wang et al. .................... 382/131 |

OTHER PUBLICATIONS

Gruetter, Rolf, "Automatic, Localized in Vivo Adjustment of all First-and Second-Order Shim Colils", Magnetic REsonance in Medicine, (1993), 804-811.

Gruetter, Rolf, et al., "Field Mapping Without Reference Scan Using Asymmetric Echo-Planar Techniques", Magnetic Resonance in Medicine 43:319-323(2000), (2000), 1-5.

Liu, W., et al., "In vivo MRI using positive-contrast techniques in detection of cells labeled with superparamagnetic iron oxide nanoparticles", NMR in Biomedicine, 21, (2008), 242-250.

Mills, P. H., et al., "Sensitive and automated detection of iron-oxide-labeled cells using phase image cross-correlation analysis", Magnetic Resonance Imaging, 26, (2008), 618-628.

* cited by examiner

DIPOLE MATCHED FILTER FOR MRI

CLAIM OF PRIORITY

This patent application claims the benefit of priority, under 35 U.S.C. Section 119(e), to Curtis A. Corum, et al., U.S. Provisional Patent Application Ser. No. 61/259,980, entitled "DIPOLE MATCHED FILTER FOR MRI," filed on Nov. 10, 2009, and is incorporated herein by reference.

STATEMENT REGARDING FEDERALLY SPONSORED RESEARCH OR DEVELOPMENT

This invention was made with government support under award number P41RR008079 from National Institutes of Health. The government has certain rights in this invention.

BACKGROUND

Standard magnetic resonance imaging sequences can exhibit undesirable artifacts under certain conditions. One such artifact is a signal dropout which is sometimes observed when imaging a large, local dipole. Present systems for magnetic resonance imaging are inadequate.

OVERVIEW

The present subject matter includes a method for generating an image using magnetic resonance imaging. According to one example, the image is generated using a template and data expressed in k-space. The template is convoluted with the image. Convolution in real space can be determined using k-space multiplication. In one example, the template and the k-space data is analyzed to determine an image corresponding to the specimen. The template is selected based on the dipole under examination.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present subject matter includes a system and method for improved magnetic resonance imaging. In some imaging sequences, a local dipole can cause a signal dropout. The present subject matter includes a dipole matched filter configured to suppress a background portion of the image. According to one example of the present subject matter, the dipole (on average), becomes higher than the surroundings. With a signal-preserving sequence, such as SWIFT, UTE, and SWIFT-LiTE, the signal to background is improved.

The present subject matter can be applied to previously acquired data or data acquired in real time. In one example, the present subject matter can be viewed as a form of inverse filtering.

There is renewed interest in capturing information from the local macroscopic magnetic field in MRI, especially with the increasing availability of higher field systems. Phase contrast imaging techniques, positive contrast sequences for visualizing FE nano-particles, as well susceptibility weighted imaging all have a component of sensitivity to local field perturbations.

An example of the present subject matter is directed to extracting information about the presence of a local dipole field in an MRI dataset. Information can be extracted based on selection and application of an excitation sequence, based on post-processing of the data, or based on a combination of the sequence and post-processing. One example concerns obtaining "positive" contrast from paramagnetic contrast agents such as iron oxide nano-particles.

Figure 1:
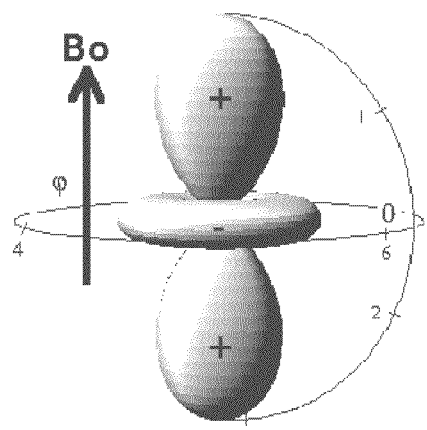
FIG. 1 includes a dipole filter model.

According to one example, a SWIFT sequence in combination with a Varian Inova console utilizing vnmrj "classic" software provides suitable results. The present subject matter can include post-processing based on a multiplicative or "matched" filter in K-space. The filter, in one example, has a secular dipole field pattern. The filter in K-space has the advantage of being scale invariant (it is a function of angle only, not radius). It also has "high pass" property of suppressing a uniform background signal, in other words the "dc" spatial frequency response is zero. The filter function in k-space is given by: $\Lambda(\theta)=[3\cos^2(\theta)-1]/2$ where $\theta$ is the polar angle with $B_0$ as the axis, as indicated in FIG. 1. FIG. 1 illustrates a secular dipole pattern in k-space. Complex k-space data is multiplied by this real valued 3D angular-only function.

Experiments can be conducted on 4 T human magnet system using a quadrature single breast coil along with an integrated Echotek (Mercury Computer Systems) based IF digital receiver system. Signal processing and image reconstruction applications can be implemented using Matlab (Mathworks), "ifort" fortran (intel) and LabVIEW G (National Instruments).

Figures 2A, 2B:
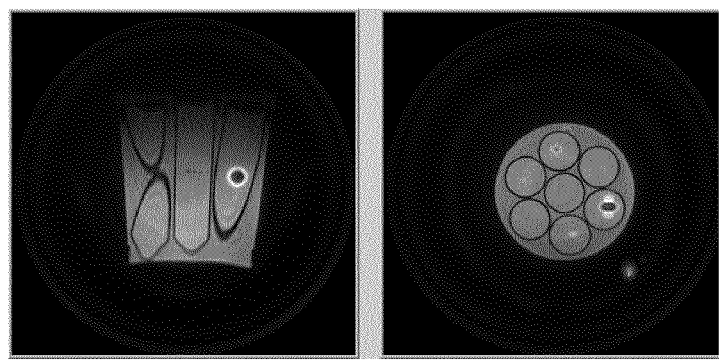
FIGS. 2A and 2B include images.
Figures 3A, 3B:
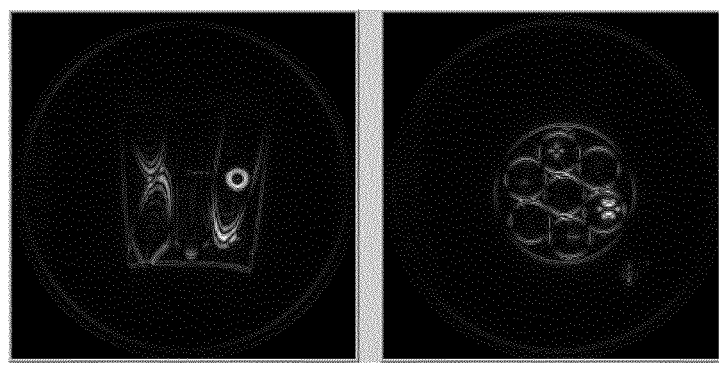
FIGS. 3A and 3B include images.

Phantom data at 4 T is shown in FIGS. 2A and 2B and in FIGS. 3A and 3B. FIGS. 2A and 2B show a 62.5 kHz SWIFT image with 96,000 radial views (8 min) and 4 deg nominal flip and includes a phantom containing Ti ball-bearings and plastic mesh (only when visible) in 50 mL centrifuge tubes containing agar gel. The complex image is presented in magnitude mode. The phantom consists of 7 centrifuge tubes (50 mL) containing 1% Agar gel. In addition some of the tubes contain Ti ball bearings, which due to their spherical shape and material homogeneity form an ideal dipole field pattern outside their volume. The tubes are submerged in water in a 500 mL tapered cylindrical plastic container. Some of the tubes also contain a horizontal patch of plastic mesh. Compare the filtered dataset in FIG. 3. FIGS. 3A and 3B show the phantom containing Ti ball-bearings after dipole amplitude filter in k-space, and in the figures, the uniform signal from Agar and water is suppressed. Locations of the dipole artifact are greatly enhanced relative to the background, and their size is slightly increased.

The combination of SWIFT and a secular dipole amplitude filter in k-space is effective for obtaining positive contrast from local dipole field perturbations in MRI.

Additional Notes

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown and described. However, the present inventors also contemplate examples in which only those elements shown and described are provided.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code may be tangibly stored on one or more volatile or non-volatile computer-readable media during execution or at other times. These computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A method comprising:
   receiving k-space data corresponding to magnetic resonance data for a subject;
   selecting a template for analysis, the template selected based on a local dipole field in the magnetic resonance data for the subject; and
   generating an image using the k-space data and using the template, the image generated by multiplying the template and the k-space data.

2. The method of claim 1 wherein receiving k-space data includes generating data using a SWIFT protocol.

3. The method of claim 1 wherein receiving k-space data includes generating data using a UTE protocol.

4. The method of claim 1 wherein receiving k-space data includes generating data using a SWIFT-LiTE protocol.

5. The method of claim 1 wherein selecting the template includes selecting a dipole model.

6. The method of claim 1 wherein selecting the template includes selecting a kernel using a dipole model.

7. The method of claim 6 wherein generating the image includes positioning the kernel at a plurality of locations in the k-space data.

8. The method of claim 1 wherein generating the image includes comparing the template and the k-space data.

9. The method of claim 1 wherein generating the image includes attenuating if the template corresponds to the k-space data corresponds to a match.

10. The method of claim 1 wherein generating the image includes attenuating if the template differs from the k-space data.

11. The method of claim 1 wherein generating the image includes enhancing if the template differs from the k-space data.

12. The method of claim 1 wherein generating the image includes generating an image exhibiting negative contrast.

13. A non-transitory computer readable medium having instruction stored thereon to perform a method comprising:
    receiving k-space data corresponding to magnetic resonance data for a subject;
    selecting a template for analysis, the template selected based on a local dipole field in the magnetic resonance data for the subject; and
    generating an image using the k-space data and using the template, the image generated by multiplying the template and the k-space data.

14. The computer readable medium of claim 13 wherein receiving k-space data includes generating data using a SWIFT protocol.

15. The computer readable medium of claim 13 wherein receiving k-space data includes generating data using a UTE protocol.

16. The computer readable medium of claim 13 wherein receiving k-space data includes generating data using a SWIFT-LiTE protocol.

17. The computer readable medium of claim 13 wherein selecting the template includes selecting a dipole model.

18. The computer readable medium of claim 13 wherein selecting the template includes selecting a kernel using a dipole model.

19. The computer readable medium of claim 18 wherein generating the image includes positioning the kernel at a plurality of locations in the k-space data.

20. The computer readable medium of claim 13 wherein generating the image includes comparing the template and the k-space data.

21. The computer readable medium of claim 13 wherein generating the image includes attenuating if the template corresponds to the k-space data corresponds to a match.

22. The computer readable medium of claim 13 wherein generating the image includes attenuating if the template differs from the k-space data.

23. The computer readable medium of claim 13 wherein generating the image includes enhancing if the template differs from the k-space data.

24. The computer readable medium of claim 13 wherein generating the image includes generating an image exhibiting negative contrast.

25. A method comprising:
 receiving magnetic resonance data; and
 generating an image using a filter, the filter including a secular dipole model corresponding to a local dipole field in the magnetic resonance data, the image generated by multiplying the secular dipole model and k-space data, the k-space data corresponding to the magnetic resonance data.

\* \* \* \* \*